United States Patent [19]

Riermeier et al.

[11] Patent Number: 4,838,951

[45] Date of Patent: Jun. 13, 1989

[54] SOLAR MODULE MOUNTING ARRANGEMENT USING ANGLE BRACKETS

[75] Inventors: Manfred Riermeier, Neuching; Viktor Schuber, Munich, both of Fed. Rep. of Germany

[73] Assignee: Siemens Aktiengesellschaft, Berlin and Munich, Fed. Rep. of Germany

[21] Appl. No.: 72,198

[22] Filed: Jul. 10, 1987

Related U.S. Application Data

[63] Continuation of Ser. No. 837,234, Mar. 7, 1986, abandoned.

[30] Foreign Application Priority Data

Apr. 17, 1985 [DE] Fed. Rep. of Germany ....... 3513894

[51] Int. Cl.$^4$ ............................................. H02N 6/00
[52] U.S. Cl. ..................................... 136/251; 126/450
[58] Field of Search ................ 136/244, 251; 126/450

[56] References Cited

U.S. PATENT DOCUMENTS

| | | | |
|---|---|---|---|
| 4,101,101 | 7/1978 | Barkats et al. | 244/173 |
| 4,231,807 | 11/1980 | Keeling et al. | 136/251 |
| 4,336,413 | 6/1982 | Tourneux | 136/251 |
| 4,378,006 | 3/1983 | Hawley | 126/417 |
| 4,392,009 | 7/1983 | Napoli | 136/251 |
| 4,433,200 | 2/1984 | Jester et al. | 136/251 |

FOREIGN PATENT DOCUMENTS

| | | | |
|---|---|---|---|
| 2936764 | 3/1981 | Fed. Rep. of Germany | 136/251 |
| 1556758 | 2/1969 | France . | |
| 1603980 | 12/1981 | United Kingdom . | |

Primary Examiner—Aaron Weisstuch
Attorney, Agent, or Firm—John F. Moran

[57] ABSTRACT

A solar module mounting arrangement having a frame is composed of a plurality of components in a predetermined shape or profile. The solar modules in the frame are able to be secured so as to be stable over the long term and in a dense packing arrangement having the smallest possible space requirement. An angle bracket (2) provided with a mounting means (5) which serves to attach the solar module to a support base is arranged between at least two adjacent components (3) of the frame. A corner of the compound solar module (4) between the adjacent components (3) of the frame is provided with a recess (15). In this way, the angle bracket (2) is arranged in such a manner that a plurality of such solar modules can be arranged one beside another without spacing (dead space) between the solar modules.

4 Claims, 1 Drawing Sheet

SOLAR MODULE MOUNTING ARRANGEMENT USING ANGLE BRACKETS

This is a continuation of application Ser. No. 837,234, filed Mar. 7, 1986, now abandoned.

BACKGROUND OF THE INVENTION

The invention relates to solar modules, and more particularly, it relates to a dense packed mounting arrangement wherein the mounting frame occupies a minimal area.

Two basic techniques for the production of solar modules are currently in use. The first technique is known as the double glass technique. In the double glass technique solar cells are embedded, together with their electrical wiring, between two glass plates by means of a synthetic resin liquid or by means of a thermoplastic foil material.

Another production technique for solar modules is the so-called superstrate technique where a glass plate is also used to cover the front of a solar module while the rear portion of the solar module is constructed from synthetic resin foils, for example aluminum-coated foils. The solar cells, together with their electrical wiring, are again embedded between the front and back of the solar module by means of thermoplastic foils.

Conventional processes for the production of such solar modules are described, for example, in the U.S. Pat. Nos. 4,067,764, 4,224,081, 4,231,807, 4,371,739, 4,433,200 and 4,401,839.

The solar modules are generally secured together by aluminum or steel frames sealed, for example, with silicone.

Solar modules can be attached by clips to a flat base or a suspended base. However, a clip attachment is not always durable.

SUMMARY OF THE INVENTION

An object of the present invention is to provide a dense packed mounting arrangement for solar modules which are secured so as to be stably mounted for a long term and which has the smallest possible space requirement.

Solar modules produced in accordance with the invention can be arranged directly adjacent to one another without any space existing between external frame elements of the various solar modules, even in sections. In this way, the solar energy produced per unit area of a support base is optimized. A solar module in accordance with the invention need not necessarily have four sides. A solar module in accordance with the invention can have any arbitrary number n of corners provided with such n-cornered solar modules, together with other n-cornered solar modules, to cover a support base in such a way that no space remains between the individual solar modules, apart from the rounding off of the frame edges. Consequently a 90° angle also need not necessarily exist between the two elongated members which serve to support the angle bracket in the solar module frame.

An angle bracket between two adjacent components of a solar module frame can be provided with a hole or a pin for the mounting of the solar module to a support base. The securing pin can be provided either with a screw thread or a pin hole. To improve the ventilation underneath the solar module, the solar module can be mounted to the support base by means of spacers attached to the angle brackets in such a manner that the rear of the solar module is spaced from the support base. The spacers may consist, for example, of shim plates on a securing pin of the angle bracket.

In an illustrative embodiment of the invention for framing a planar solar panel and mounting the solar panel to a support base, the framing and mounting apparatus comprises four elongated frame members and four joining members. Each joining member is disposed between two elongated frame members which are positioned with respect to each other to form an angle therebetween. Each joining member is in the form of an angular bracket and includes two projections, each one of which slideably engages with one elongated frame member and defines the angular orientation between the two elongated frame members. Each elongated frame member is secured to its respective projection and each joining member has an aperture passing through it perpendicular to the plane of the solar panel for mounting the frame of the solar panel to the support base.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
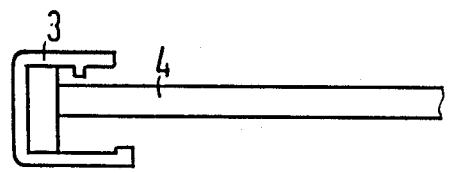
FIGS. 1 through 6 depict a solar module comprising an angle bracket in accordance with the invention.

FIG. 1 is a cross-section through a frame profile of an elongated component 3 of a frame in accordance with the inventive principles.

Figure 2:
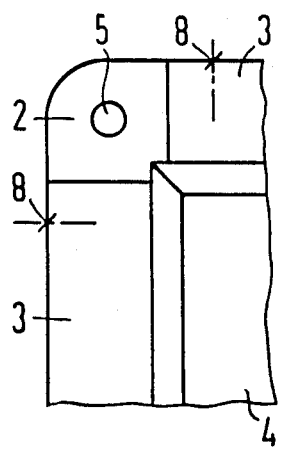

FIG. 2 is a plan view of a part of a solar module comprising an angle bracket 2 in accordance with the invention. Here it can be clearly seen that this angle bracket 2 has no flange and therefore is not bulky. The outer dimensions of the solar module corresponding to a frame profile as shown in FIG. 1 are retained and are not increased by the use of an angle bracket 2 comprising means for mounting the solar module.

Figure 3:
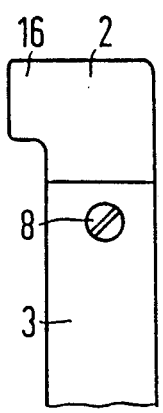

FIG. 3 illustrates the structure shown in FIG. 2 in a side view which clearly shows the head of a screw 8 which is screwed through a bore in the end side of the elongated component 3 of the frame and through a threaded hole 12 in the projection 13 which serves to secure the angle bracket 2 to the frame component 3. Since two elongated components 3 are secured to a common angle bracket 2, components 3 are held rigidly in position to each other via angle bracket 2.

Figure 4:
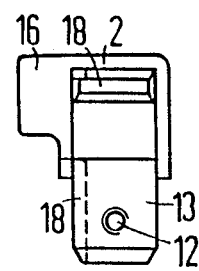

FIG. 4 is a section through the structure of FIG. 2 in parallel to the plane shown in FIG. 3. Here the projection 13 which serve to secure the angle bracket 2 to the frame component can be clearly seen.

Figure 5:
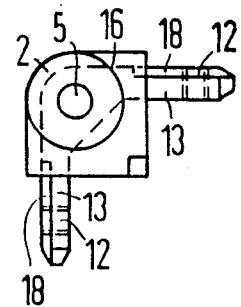

FIG. 5 represents the angle bracket 2 in accordance with the invention. Here the two projections 13 each possess an inner threaded hole 12. in place of the inner thread 12 or in addition to the inner thread 12, it is naturally also possible to provide a recess for the positioning of a countersunk screw.

Figure 6:
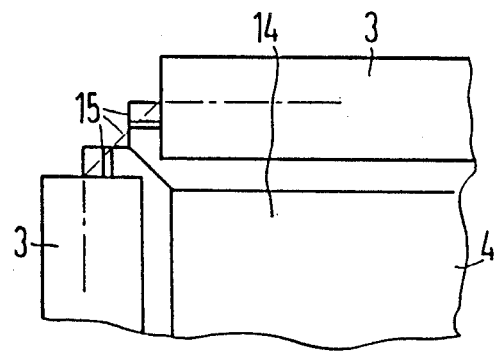

FIG. 6 clearly shows how a portion of a compound solar module 4, which has already been provided with adjacent elongated extensions components 3 of the frame and which has a glass plate 14 on its upper side, must be provided with recesses 15 in order that an angle bracket 2 in accordance with the invention can be fitted. The recesses 15 can be produced by piercing, cutting, punching, etc. The recesses 15 are necessary in order that a pin may be passed through the mounting hole 5 or to provide sufficient space for a mounting pin already integrated into the angle bracket 2. The construction of FIG. 6 enables panels 4 to be mounted adjacently in a compound solar module-frame.

A compound solar module 4 need not necessarily include a glass plate 14. The invention can be applied to any solar module whose exterior has a frame which can be composed of a plurality of components.

In FIGS. 3 and 4, the angle bracket 2 has a pedestal 16 which is integrated into the angle bracket 2 and which serves to space the angle bracket from the support base of the solar module.

The mounting hole 5 extends through this pedestal 16. As an alternative, the pedestal 16 can be provided with a mounting pin.

When a plurality of solar modules are arranged beside one another without spacing between them it is advantageous that the angle bracket 2 should be provided with water discharge openings 18. Such openings 18 can be drilled or produced in the form of slots or in some other fashion during the casting of the angle bracket 2. In this arrangement the spacing between adjacent solar modules directly corresponds to the thickness of frame member 3.

The angle bracket 2 may be readily produced from die-cast aluminum.

The glass plate 14 is supported by a rubber seal in the frame which is formed by the components 3 and the angle brackets 2. The groove in this rubber seal, shown in FIG. 6 in this recess 15, is of no significance to the invention.

There has thus been shown and described novel mounting apparatus for solar modules which fulfills all the objects and advantages sought therefor. Many changes, modifications, variations and other uses and applications of the subject invention will, however, become apparent to those skilled in the art after considering the specification and the accompanying drawings which disclose embodiments thereof. All such changes, modifications, variations and other uses and applications which do not depart from the spirit and scope of the invention are deemed to be covered by the invention which is limited only by the claims which follow.

We claim:

1. Apparatus for a planar solar module including means for mounting said solar module to a support base, the apparatus comprising:

four elongated frame members and four joining members, each joining member in the form of an angle bracket being disposed between two adjacent elongated frame members, and each angle bracket having a single aperture for mounting said solar module to a support base, the aperture passing completely through the angle bracket in a direction perpendicular to the plane of said solar module, and each angle bracket also having two projection means extending in an orientation parallel to the plane of said solar module, each one of said two projections means engaging one of the the two adjacent elongated frame members, said two projections means defining an angle therebetween, and securing means for attaching each elongated frame member to one of the two projections means to provide an angular orientation between the two adjacent elongated frame members commonly secured to an angle bracket corresponding to said angle.

2. Apparatus in accordance with claim 1, wherein the securing means associated with the projection means includes a threaded aperture and each elongated frame member has a corresponding aperture to enable each elongated frame member to be secured to each projection means via a screw.

3. Apparatus in accordance with claim 1, wherein each angle bracket includes a passage for the discharge of water.

4. Apparatus in accordance with claim 1, wherein each angle bracket includes a support projection located so that the single aperture for mounting the solar module passes through the support projection.

* * * * *